(12) United States Patent
Watanabe et al.

(10) Patent No.: US 6,736,947 B1
(45) Date of Patent: May 18, 2004

(54) SPUTTERING TARGET, Al INTERCONNECTION FILM, AND ELECTRONIC COMPONENT

(75) Inventors: Koichi Watanabe, Yokohama (JP); Takashi Ishigami, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/582,284

(22) PCT Filed: Dec. 24, 1998

(86) PCT No.: PCT/JP98/05856

§ 371 (c)(1),
(2), (4) Date: Jun. 23, 2000

(87) PCT Pub. No.: WO99/34028

PCT Pub. Date: Jul. 8, 1999

(30) Foreign Application Priority Data

Dec. 24, 1997 (JP) ............................................. 9-366475
Feb. 9, 1998 (JP) ........................................... 10-027164
May 28, 1998 (JP) ........................................... 10-147996

(51) Int. Cl.$^7$ ......................... C23C 14/32; C22C 21/00; C22C 27/00; H01L 23/12
(52) U.S. Cl. .................. 204/298.13; 257/416; 257/734; 257/771; 428/1.1; 204/298.12; 420/528; 420/529; 420/537; 420/538; 420/548; 420/549; 420/550; 420/551; 420/552; 420/580; 420/581; 420/587; 420/588; 148/421; 148/422; 148/423; 148/424; 148/426; 148/432; 148/437; 148/438; 148/442
(58) Field of Search ....................... 204/298.12, 298.13; 420/528, 529, 537, 538, 548, 549, 550, 551, 552, 580, 581, 587, 588; 148/421, 422, 423, 424, 426, 432, 437, 438, 442; 257/416, 734, 771; 428/1.1

(56) References Cited

U.S. PATENT DOCUMENTS 5,244,556 A  *  9/1993  Inoue ..................... 204/192.12
5,500,301 A  *  3/1996  Onishi et al. ................ 428/457

FOREIGN PATENT DOCUMENTS

| EP | 0855451 | * | 7/1998 |
| JP | 4-99171 |   | 3/1992 |
| JP | 5-335271 |  | 12/1993 |
| JP | 7-4555 |   | 2/1995 |
| JP | 8-37186 |  | 2/1996 |
| JP | 8-64554 |  | 3/1996 |
| WO | WO9713885 | * | 4/1997 |

* cited by examiner

*Primary Examiner*—Rodney G. McDonald
(74) *Attorney, Agent, or Firm*—Foley & Lardner

(57) ABSTRACT

A sputtering target consists essentially of 0.1 to 50% by weight of at least one kind of element that forms an intermetallic compound with Al, and the balance of Al. The element that forms an intermetallic compound with Al is uniformly dispersed in the target texture, and in a mapping of EPMA analysis, a portion of which count number of detection sensitivity of the element is 22 or more is less than 60% by area ratio in a measurement area of 20×20 $\mu$m. According to such a sputtering target, even when a sputtering method such as long throw sputtering or reflow sputtering is applied, giant dusts or large concavities can be suppressed in occurrence.

5 Claims, No Drawings

SPUTTERING TARGET, Al INTERCONNECTION FILM, AND ELECTRONIC COMPONENT

TECHNICAL FIELD

The present invention relates to a sputtering target suitable for formation of wiring of low resistance, an Al wiring film using the same, and electronic components comprising the Al wiring film such as semiconductor elements, liquid crystal display devices, surface acoustic wave devices or the like.

BACKGROUND ART

Recently, semiconductor industry typical in LSI is rapidly advancing. In semiconductor elements such as DRAMs, as higher integration and reliability advance, accuracy required for fine machining is also getting higher and higher. Further, for also sputtering targets being employed in forming wiring or the like, a more homogeneous metallic layer is demanded to form.

Among various kinds of metals for formation of the wiring, aluminum (Al) is attracting attention as formation material of low resistance wiring. Al is also expected as a wiring film being used as gate lines and signal lines of a TFT drive type liquid crystal display device (LCD). This is because as the size of LCD screen becomes larger, the wiring film of lower resistance is in demand. For instance, a large LCD of such as more than 10 inches necessitates the wiring of lower resistance of 10 $\mu\Omega$ cm or less.

Due to the Al wiring, the low resistance wiring can be realized. However, the Al film, due to heating at approximately 673K during heat treatment after CVD processing or wiring formation, generates protrusions called as hillock. This is because in the course of stress release of the Al film due to heating, Al atoms diffuse to generate the protrusions accompanying the diffusion of the Al atoms. Such protrusions, when generated in the Al wiring, adversely affect on the later process to cause problems.

Thereupon, it is tried to add a slight amount of metallic elements such as Cu, Si, Pd, Ti, Zr, Hf, Nd and Y to the Al wiring (Japanese Patent Laid-Open Publication No. HEI 5-335271). Specifically, these metallic elements are added to an Al target itself. Such metallic elements as mentioned above, forming an intermetallic compound with Al, function as trapping material of Al. Thereby, the aforementioned hillocks are suppressed from forming. In forming Al wiring for highly integrated semiconductor elements and large size LCDs, the Al alloy target that contains a slight amount of such a metallic element is in use.

Now, as higher integration, higher reliability and higher functionality of electronic devices such as semiconductor elements proceed, the structure thereof has become more complicated. As a result of this, a multi level interconnection structure has come to be adopted. Accordingly, further technological innovation is required in fine machining technology. In addition to the wiring, further improvement of reliability and longevity are in demand. For such purposes, sputtering films of high denseness and high orientation are in demand. Since such sputtering films are difficult to obtain by use of the existing general sputtering methods, new sputtering methods such as long throw sputtering or reflow sputtering are being adopted.

In sputtering by the general sputtering method, when segregation or internal defect exists in a target, dust or splash may occur due to an extraordinary electric discharge or the like. These cause defects during formation of DRAMs or TFT elements. There, investigation and elucidation of mechanism causing the dust or splash is in advance, and at the same time, development of preventive measure is also in progress. Some results are being obtained.

However, in the new sputtering methods such as the aforementioned long throw sputtering or reflow sputtering, higher power or higher temperature than ever is being advanced. Accordingly, thermal influence upon a target is becoming more than ever. In the long throw sputtering or reflow sputtering, the thermal influence on the target reaches up to for instance approximately 500° C.

When forming, due to the long throw sputtering or reflow sputtering exposing the target to such severe conditions as mentioned above, an Al wiring film with an Al alloy target including a slight amount of metallic elements such as Cu, Si, Nd, Y or the like, lots of defect modes that have never been ascertained are found to occur. That is, there occurs lots of giant dust particles having a size such large as from 100 to 5000 $\mu$m in the sputtered film to remarkably deteriorate yield of electronic devices such as DRAMs or TFT elements.

Further, in the long throw sputtering or reflow sputtering, there occur a problem that concavities or holes of relatively larger size occur in the sputtering films. These concavities or holes cause to deteriorate electromigration resistance or stress migration resistance. Accordingly, the yield of electronic devices such as DRAMs or TFT elements is deteriorated.

The existing dust preventive measure can not prevent the aforementioned giant dust particles or relatively large size concavities from occurring. Accordingly, sounder fine wiring networks are in demand to be formed by use of the long throw sputtering or reflow sputtering.

Further, in the Al wiring (Al alloy wiring) including a slight amount of the aforementioned metallic elements, due to the intermetallic compound formed between Al and an added element, Al can be suppressed from diffusing. However, there is a problem that a generated intermetallic compound can adversely affect on etching property of the Al wiring. That is, when dry etching such as CDE (Chemical Dry Etching) or RIE (Reactive Ion Etching), or wet etching is applied to the Al wiring film that contains an intermetallic compound, the intermetallic compound cause insoluble remains called as residue. This is largely detrimental in forming the fine wiring network.

From the above, in the Al target and Al wiring that are employed for forming the low resistance wiring, it is demanded to suppress the diffusion of Al due to the heating after film formation to prevent the hillock or the like from occurring. In addition to this, it is demanded for the residue also to be suppressed during etching.

An object of the present invention is to provide a sputtering target that enables to suppress new defect modes (giant dust particles or large concavities) from occurring.

The new defect modes occur in particular, when the new sputtering methods such as long throw sputtering or reflow sputtering are employed. Further, the object includes, due to the use of such sputtering target, to provide Al wiring films that are excellent in hillock resistance and formation property of fine wiring network, and electronic components using such Al wiring films.

Further, another object of the present invention is to provide a sputtering target that can form with reproducibility Al wiring films of low resistance that are capable of preventing etching residue as well as hillock from occurring. Further, the object includes, by employing such sputtering target, to provide Al wiring films excellent in hillock resistance and formation property of fine wiring network, and electronic components employing such Al wiring films.

DISCLOSURE OF THE INVENTION

A first invention of the present application enables, through elucidation of reasons why to cause giant dust particles in the new sputtering method such as long throw sputtering or reflow sputtering, to suppress giant dust particles or the like from occurring. The first invention, by stipulating the degree of dispersion of added elements in a sputtering target with the mapping of EPMA (Electron Probe X-ray Microanalyzer) analysis, suppresses the giant dust particles from occurring.

A sputtering target of the first invention consists essentially of 0.1 to 50% by weight of at least one kind of element that forms an intermetallic compound with Al, and the balance of Al. Here, the element that forms the intermetallic compound is uniformly dispersed in the target texture, and, in a mapping of EPMA analysis, a portion of which count number of detection sensitivity of the element is 22 or more is less than 60% by area ratio in a measurement area of 20×20 $\mu$m.

The other sputtering target of the first invention consists essentially of 0.1 to 50% by weight of at least one kind of element selected from a group consisting of Cu, Si, Sc, Y, La, Ce, Nd, Sm, Gd, Tb, Dy, Er, Pt, Ir, Ru, Pd, Ti, Zr, V, Nb, Ta, Fe, Ni, Cr, Mo, W, Mn, Tc, Re and B, and the balance of Al. Here, the element is uniformly dispersed in the target texture, and, in the mapping of EPMA analysis, a portion of which count number of detection sensitivity of the element is 22 or more is less than 60% by area ratio in a measurement area of 20×20 $\mu$m.

The sputtering target of the first invention is further characterized in that, in the aforementioned mapping of EPMA analysis, a portion of which count number of the aforementioned element that forms the intermetallic compound or the element selected from the aforementioned group is 22 or more is less than 10% by area ratio in a measurement area of 200×200 $\mu$m.

An Al wiring film of the first invention is characterized in that the Al wiring film is formed by use of the aforementioned sputtering target. The electronic component of the first invention comprises the aforementioned Al wiring film. As concrete examples of the electronic components, semiconductor elements, liquid crystal display devices, surface acoustic wave devices or the like can be cited.

In the new sputtering method such as long throw sputtering or reflow sputtering, higher power and higher temperature more than ever are in advance. Accordingly, thermal influence upon the target becomes more than ever (for example, approximately 500° C.). Accordingly, the temperature of the sputtering target surface during sputtering becomes higher more than ever. Thereby, free energy of atoms constituting the target becomes large.

Accompanying such phenomena, the added element seeks for a stable area to precipitates at the grain boundary. Due to the precipitation of the added element, there occurs a large difference of the sputtering rate between the grain boundary and the interior of the grain to result in for only the interior portion of the grain to locally remain. Accordingly, on the surface of the target large unevenness is generated. When the sputtering is continued on in such a state, the rebounded sputtered particles begin sticking on the generated projections. Thereby, the projections become gigantic in the size thereof. Such projections fly off the sputtering target as a mass, thereby the giant dust particles stick on the substrate.

As mentioned above, due to an increase of thermal influence on the target, the added element precipitates at the grain boundary to generate the giant dust particle. The more non-uniform the initial state of dispersion is, that is the more segregated the added elements are, the more remarkable the precipitation of the added element becomes.

There, in the sputtering target of the first invention, the dispersion degree of the added element, in the mapping of EPMA analysis, is stipulated so that a portion where the count number of detection sensitivity of the added element is 22 or more is less than 60% by area ratio in a measurement area of 20×20 $\mu$m. By satisfying such a state of dispersion, the precipitation of the added elements can be suppressed, thereby the giant dust particles can be suppressed from occurring.

According to the wiring film formed by use of the sputtering method such as long throw sputtering or reflow sputtering with the aforementioned first sputtering target, the giant dust particles can be suppressed from occurring. Accordingly, the product yield can be remarkably improved. In addition to this, based on the sputtering methods as described above, the Al wiring film of high denseness and high orientation can be provided.

A second invention of the present application, through elucidation of reasons why to cause the relatively large concavities or holes in the new sputtering method such as long throw sputtering or reflow sputtering, enables to suppress the giant dust particles and relatively large concavities and holes both based on the giant dust particles from occurring. In the second invention, by stipulating the dispersion degree of impurity elements such as Cr, Fe, C or the like in a target with the mapping of EPMA analysis, giant dust particles and relatively large concavities and holes both due to the giant dust particles are suppressed from occurring.

In a sputtering target in the second invention, a first mode is a sputtering target consisting essentially of 0.1 to 50% by weight of at least one kind of element that forms an intermetallic compound with Al, and the balance of Al. Cr contained in the aforementioned target is characterized in that, in the mapping of EPMA analysis, a portion of which count number of detection sensitivity of Cr is 33 or more is less than 60% by area ratio in a measurement area of 20×20 $\mu$m.

A second mode is a sputtering target consisting essentially of 0.1 to 50% by weight of at least one kind of element that forms an intermetallic compound with Al, and the balance of Al. Fe contained in the target is characterized in that, in the mapping of EPMA analysis, a portion of which count number of detection sensitivity of Fe is 20 or more is less than 60% by area ratio in a measurement area of 20×20 μm.

A sputtering target of a third mode is a sputtering target consisting essentially of 0.1 to 50% by weight of at least one kind of element that forms an intermetallic compound with Al, and the balance of Al. C contained in the aforementioned target is characterized in that, in the mapping of EPMA analysis, a portion of which count number of detection sensitivity of C is 55 or more is less than 60% by area ratio in a measurement area of 20×20 μm.

The sputtering target of the second invention is further characterized in that, in each mapping of EPMA analysis of Cr, Fe and C as impurity element, a portion of which count number is more than the stipulated one for each element (the count numbers of Cr: 33, Fe: 20, and C: 55) is less than 10% by area ratio in a measurement area of 200×200 μm.

An Al wiring film in the second invention is one that is formed by sputtering the aforementioned sputtering target. An electronic component in the second invention is one that comprises the aforementioned Al wiring film. As concrete examples of the electronic components, semiconductor elements, liquid crystal display devices, surface acoustic wave devices or the like can be cited.

In the new sputtering methods such as long throw sputtering or reflow sputtering method, as explained above, the temperature of the target surface becomes higher than ever during sputtering, thereby the free energy of atoms constituting the target becomes larger. Accompanying such phenomena, the impurity elements contained in the target, in particular Cr, Fe and C seek a stable area to precipitate at the grain boundary. Due to precipitation of these impurity elements, there occurs a large difference in the sputtering rates between the grain boundary and the inside of the grain. Thereby, only the interior of the grain locally remains on the target surface to form a large unevenness thereon.

In a state where the large unevenness is formed on the target surface, when the sputtering is further continued on, to the projections formed, sputtered particles rebound to stick to form giant projections. These giant projections fly off the target as a mass to stick on a substrate as giant dust particles. When such giant dust particles containing the impurity elements stick to the substrate, a mode of growth of the film changes only there from others to cause a difficulty in stacking the constituent atoms thereon. Thus, concavities and holes large relative to the sputtering film are formed.

As thermal influence on the target increases, the impurity elements such as Cr, Fe and C precipitate at the grain boundary to generate relatively large concavities and holes and the giant dust particles causing these. The less uniform the initial state of dispersion of the impurity element is, in other words, the more segregated the impurity in the target is, the more conspicuous the precipitation of the impurity element becomes.

There, in the sputtering target of the second invention, the degrees of dispersion of Cr, Fe and C, with the mappings of the EPMA analysis, are stipulated in the range as described above. By satisfying such dispersion states of Cr, Fe and C, these impurity elements can be suppressed from precipitating. As a result, the relatively large concavities and holes and the giant dust particles causing these can be suppressed from occurring.

With the second sputtering target such as described above, Al wiring films are formed by use of long throw sputtering or reflow sputtering. According to thus formed Al wiring films, the relatively large concavities or holes, being suppressed from occurring, can remarkably improve the product yield. In addition to this, due to the aforementioned sputtering method, the Al wiring films or the like of higher denseness and orientation can be provided.

The sputtering targets in the first and second inventions are not restricted in application to the long throw sputtering and reflow sputtering, but can be applied even in the existing general sputtering method. The same can be said with the Al wiring films of the first and second inventions.

In a third invention of the present application, occurrence of etching residue of an Al wiring film containing an element that forms an intermetallic compound and deterioration of finely etching property can be suppressed from occurring by incorporating Ar or Kr in the Al wiring film.

A sputtering target in a third invention consists essentially of at least one kind of element that forms an intermetallic compound with Al in the range of from 0.1 to 20% by weight, at least one kind of element selected from Ar and Kr by 5% by weight or less (not including 0% by weight), and the rest of Al.

Another sputtering target in the third invention consists essentially of at least one kind of element selected from Y, Sc, La, Ce, Nd, Sm, Gd, Tb, Dy, Er, Th, Si, Sr, Ti, Zr, V, Nb, Ta, Mn, Tc, Re, Cu and B in the range of from 0.1 to 20% by weight, at least one kind of element selected from Ar and Kr by 5% by weight or less (not including 0% by weight), and the rest of Al.

An Al wiring film in the third invention consists essentially of at least one kind of element that forms an intermetallic compound with Al in the range of from 0.1 to 20% by weight, at least one kind of element selected from Ar and Kr by 5% by weight or less (not including 0% by weight), and the rest of Al. Further, the Al wiring film is characterized in that it is formed by use of the aforementioned sputtering target of the third invention. An electronic component in the third invention is characterized in that the electronic component comprises the aforementioned Al wiring film. As the concrete examples of the electronic components, liquid crystal display devices, semiconductor elements, surface acoustic wave devices or the like can be cited.

In the third invention, to Al, together with an element that forms an intermetallic compound with Al such as Y, a slight amount of at least one kind of element selected from Ar and Kr is added. In the sputtering films obtained by use of such an Al target, there exist an intermetallic compound or an element that forms an intermetallic compound both poor in etching workability. However, Ar and Kr enhance their reactivity during etching. Further, Ar and Kr cause the intermetallic compound and the element themselves that forms an intermetallic compound that are poor in etching workability to finely and uniformly precipitate inside the grain of Al and at the grain boundary thereof.

Thus, Ar and Kr enhance the etching property (reactivity) of the intermetallic compound and the element itself that forms an intermetallic compound, and by finely and uniformly precipitating these, remarkably improve the etching property of the sputtered film, further can suppress the dust particles from occurring during sputtering. The added Ar or Kr does not adversely affect on suppression of diffusion of Al. Accordingly, the added element that forms an intermetallic compound can effectively prevent the hillock from occurring. Accordingly, the Al wiring films excellent in hillock resistance and in properties of forming fine wiring networks can be formed with reproducibility.

EMBODIMENTS FOR PRACTICING THE PRESENT INVENTION

In the following, modes for practicing the present invention will be explained.

A sputtering target of the present invention comprises at least one kind of element selected from a group of Cu, Si, Sc, Y, La, Ce, Nd, Sm, Gd, Tb, Dy, Er, Pt, Ir, Ru, Pd, Ti, Zr, V, Nb, Ta, Fe, Ni, Cr, Mo, W, Mn, Tc, Re and B in the range of 0.1 to 50% by weight, and the rest essentially consisting of Al. The element being added to the target is preferable to be an element that forms an intermetallic compound with Al.

As the element that forms an intermetallic compound, various kinds of metallic elements, if can form an intermetallic compound with Al, can be employed. In concrete, Cu, Si, Cr, Ni, Pt, Ir, Ta, W, Mo, Nb and Re, and rare earth elements such as Y, Gd, Nd, Dy, Sm, Er and the like can be cited. In the sputtering target of the present invention, other than these elements that form an intermetallic compound, as cited above as the element group, an element that does not form an intermetallic compound can be adopted as an element being added.

Among these various kinds of elements being added, when the sputtering target is employed for forming the wiring of a semiconductor element, such materials of high conductivity as Cu, W, Mo, Ru, Pt or the like can be preferably employed. Cu is particularly preferable. These are effective in forming ultra-fine wiring of for instance a wiring width of such as 0.25 $\mu$m or less. Further, when the sputtering target is employed for forming the wiring for a liquid crystal display device, as the element being added, rare earth elements such as Y, Gd, Nd, Dy, Sm and Er are preferably employed.

The sputtering target of the present invention is preferable to include at least one kind of element that forms an intermetallic compound with Al. The aforementioned element forms an intermetallic compound with Al (for instance, $Al_3Cu$ for copper and $Al_3Y$ for Y). Accordingly, when the obtained sputtered film is exposed to heat treatment, Al is suppressed in diffusing. As a result, the hillock or the like can be prevented from occurring.

Solubility of an element that is used to form an intermetallic compound is preferable to be 1.0% by weight or less with respect to Al. When the solubility of the element being used exceeds 1.0% by weight with respect to Al, there is a risk that sufficient suppression effect against the hillock due to formation of the intermetallic compound with Al can not be obtained. In addition, resistivity may increase.

The element that forms an intermetallic compound is contained in a sputtering target in the range of 0.1 to 50% by weight. When the content of the element that forms an intermetallic compound is less than 0.01% by weight, the aforementioned effect of suppressing the hillock can not be sufficiently exhibited. In contrast, when the content exceeds 50% by weight, the intermetallic compound increases resistance of the sputtered film, that is the Al wiring film. The more preferable amount of addition is in the range of 0.1 to 10% by weight, being further preferable to be in the range of 0.5 to 1.5% by weight.

When the sputtering target is employed in forming wiring for a liquid crystal display device, the element that forms an intermetallic compound is preferable to be contained in the range of 0.1 to 20% by weight in the sputtering target. When the content of the element that forms an intermetallic compound is less than 0.1% by weight, the aforementioned hillock suppression effect can not be sufficiently exhibited. In contrast, when the content exceeds 20% by weight, the intermetallic compound increases the resistance of the obtained sputtered film, that is the Al wiring film, and remains as residue during dry etching or wet etching. More preferable addition amount is in the range of from 1 to 15% by weight.

In the sputtering target of the present invention, the aforementioned added element is uniformly dispersed in the texture of the target. The dispersion degree of the added element is stipulated by use of the mapping of EPMA (Electron Probe X-ray Microanalyzer) analysis. That is, in the mapping of EPMA analysis of the added element such as the element that forms an intermetallic compound, a portion of which count number of detection sensitivity of the added element is 22 or more is stipulated to be 60% or less by area ratio in a measurement area of 20×20 $\mu$m. The portion of which count number of the element that forms an intermetallic compound is 22 or more is more preferable to be less than 40% by area ratio in a measurement area of 20×20 $\mu$m.

Now, the mapping of EPMA analysis in the present invention is measured under the conditions shown in Table 1.

TABLE 1

| Name of Apparatus | Electron Probe X-ray Microanalyzer by JEOL; Type JXA-8600M |
|---|---|
| ACCEL Voltage | 15 (kV) |
| Probe Current | $2 \times 10^{-7}$ (A) |
| Dual Time | 20 (ms) |
| Scan | STAGE |
| Measurement Range · | X Axis: 200 ($\mu$m) · 1 ($\mu$m) |
| Measurement Pitch | Y Axis: 200 ($\mu$m) · 1 ($\mu$m) |

According to the EPMA analysis, the state of dispersion of an element in a plane can be accurately measured. At this time, a portion where count number of detection sensitivity is 22 or more indicates an area where an element being measured is distributed much. That is, a sputtering target of the present invention in which, in the mapping of EPMA analysis of the element that forms an intermetallic compound, in a measurement area of 20×20 $\mu$m, a portion of which count number of detection sensitivity is 22 or more is stipulated to be less than 60% can be one in which the element that forms an intermetallic compound is remarkably uniformly dispersed.

By satisfying such state of dispersion of the element that forms an intermetallic compound, even when a new sputtering method such as long throw sputtering or reflow sputtering is applied, the giant dust particles can be suppressed from occurring. Even when an ordinary sputtering method is employed, by setting a portion of which count number of the element that forms an intermetallic compound is 22 or more in a measurement area of 20×20 μm at less than 60% by area ratio, the dust particles can be suppressed from occurring.

When a sputtering method such as long throw sputtering or reflow sputtering is employed, the thermal influence on a sputtering target becomes more than ever (for instance, approximately 500° C.). Accordingly, the free energy of atoms constituting the target becomes large. Accompanying such phenomenon, the element that forms an intermetallic compound or the like as an added element seeks a stable area to precipitate at grain boundary. Thereby, the sputtering rates are made largely different between the grain boundary and the interior of the grain. Accordingly, only the interiors of the grains remain locally, in addition to this giant projections are formed on the surface of the target. These fly off the surface of the target as a mass and stick on a substrate as giant dust particle.

The more non-uniform an initial dispersion state of the added element that causes giant dust particles is, in other words, the more segregated the added element is, the more conspicuous the precipitation thereof becomes. That is, in the mapping of the EPMA analysis, in a measurement area of 20×20 μm, if a portion of which count number of detection sensitivity of the added element is 22 or more exceeds 60% by area ratio, the giant dust particles are enhanced in occurrence to result in a remarkable decrease of the yield.

A portion of which count number of detection sensitivity of the added element such as an element that forms an intermetallic compound is 22 or more is preferable to be less than 10% by area ratio in an area of 200×200 μm that is an ordinary observation area in EPMA observation. When in the EPMA mapping, in a measurement area of 200×200 μm, a portion of which count number is 22 or more exists 10% or more, similarly the giant dust particles are promoted in occurrence to result in a remarkable decrease of the yield. A portion where count number of the element that forms an intermetallic compound is 22 or more is more preferable to be less than 5% in a measurement area of 200×200 μm.

Thus, the sputtering target of the present invention has an approximately uniform texture over the entire target. Accordingly, the giant dust particles can stably and with reproducibility be suppressed from occurring.

The sputtering target of the present invention is further preferable for Cr, Fe and C contained in the target as impurity elements to be uniformly dispersed. The dispersion degree of these elements can be similarly stipulated with the mappings of the EPMA analysis. The mapping of the EPMA analysis is measured under the conditions shown in Table 1.

That is, in each mapping of EPMA analysis of Cr, Fe and C, in a measurement area of 20×20 μm, the portion where the count number of detection sensitivity is 33 or more for Cr, 20 or more for Fe, and 55 or more for C respectively is stipulated to be 60% or less by area ratio. Cr, Fe and C each tends to precipitate at the grain boundary of an Al alloy target and is likely to cause relatively large concavities and holes (and giant dust particles that cause the concavities and holes) in the sputtered film.

There, for Cr, in the mapping of EPMA analysis, in a measurement area of 20×20 μm, a portion of which count number of detection sensitivity is 33 or more is stipulated to be less than 60% by area ratio. For Fe, similarly a portion of which count number of detection sensitivity is 20 or more is stipulated to be less than 60% by area ratio. For C, similarly a portion of which count number of detection sensitivity is 55 or more is stipulated to be less than 60% by area ratio. Thus stipulated Cr, Fe and C are restricted to the impurity elements in the target, and Cr and Fe, when employed as the element that forms an intermetallic compound, are not included therein.

According to the EPMA, a state of dispersion of an element in a plane can be accurately measured. A portion of larger count number of detection sensitivity at this time shows an area abundant in distribution of an element to be measured. That is, in the mapping of EPMA analysis of Cr, Fe and C each, in a measurement area of 20×20 μm, the portion of which count number of detection sensitivity is 33 or more, 20 or more, and 55 or more, respectively, is stipulated to be less than 60%. The sputtering target of the present invention can be said one in which the unavoidable impurity elements are uniformly dispersed.

As mentioned above, by uniformly dispersing Cr, Fe and C, even when a new sputtering method such as long throw sputtering or reflow sputtering is applied, the giant dust particles and relatively large concavities and holes both due to the giant dust particles can be suppressed from occurring. Even in an ordinary sputtering method, the dust particles also can be suppressed from occurring.

When the sputtering method such as long throw sputtering or reflow sputtering is applied, as mentioned above the free energy of atoms constituting the target becomes larger. Accompanying such phenomena, Cr, Fe and C contained in the target seek a stable area to precipitate at the grain boundary. Thereby, sputtering rates become largely different between the grain boundary and the interior of the grain. Accordingly, only the interior portions remain locally to result in large projections formed on the surface of the target. These fly off the target as a mass to stick on the substrate as the giant dust particles.

When such a giant dust particle sticks on a substrate, only there the mode of growth of the film changes to cause difficulties in further stacking the atoms constituting the film thereon. Accordingly, relatively large concavities and holes are formed in the sputtered film. Precipitates of the respective elements causing the relatively large concavities and holes become more conspicuous as the initial state of dispersion thereof is less uniform, in other words, as each element is more segregated. That is, in the mapping of the EPMA analysis of Cr, Fe and C each, in a measurement area of 20×20 μm, when each portion of which count number of detection sensitivity is 33 or more, 20 or more and 55 or more occupies 60% or more by area ratio, the giant dust particles and relatively large concavities and holes caused by the giant dust particles are promoted in occurring to result in a large decrease of the yield of the sputtered films (Al wiring films).

The portion where the count number of detection sensitivity of Cr, Fe and C each exceeds each stipulated value, that is, the portion of 33 or more for Cr, 20 or more for Fe and 55 or more for C, is preferable to exist less than 10% by area ratio in a measurement area of 200×200 μm. In the mapping of EPMA analysis, in a measurement area of 200×200 μm, when the portion of which count number exceeds the each stipulated value exist 10% or more by area ratio, similarly the giant dust particles are promoted in occurring to result in a conspicuous decrease of the yield. The portion where the count number of the each element exceeds the each stipulated value is further preferable to be less than 5% in the each measurement areas of 200×200 μm.

Thus, the sputtering target of the present invention has an approximately uniform texture including impurity elements such as Cr, Fe and C throughout an entire target area. Accordingly, the occurrence of the giant dust particles and the relatively large concavities and holes caused by the giant dust particles can be suppressed with stability and reproducibility. In the sputtering target of the present invention, though Cr, Fe and C are stipulated by the states of dispersion as the impurity elements, it is beyond question that the amount of the impurity elements is better to be essentially low. As a specific amount (total amount) of the impurity elements, 1% by weight or less is preferable. Cr as an impurity element is preferable to be 0.1% by weight or less, Fe is 0.1% by weight or less, and C is 0.05% by weight or less.

The sputtering targets of the present invention such as described above can be produced by use of various kinds of known production methods such as atmospheric fusion method, vacuum fusion method, quench hardening method (spray forming method), powder metallurgy method or the like. However, the following production process is particularly preferably applied.

First, high purity Al (for instance, purity of 99.99% or higher) is compounded with a prescribed amount of an element being added to produce an ingot by use of for instance continuous casting method (atmospheric fusion). Here, when Al alloy raw material is atmosphere fused, it is preferable for the molten metal to be bubbled by the inert gas such as Ar. The bubbling due to Ar or the like not only contributes in simply decreasing the amount of the impurity elements but also has an effect of uniformly dispersing Cr, Fe and C that tend to unavoidably remain. Thereby, even if the content is approximately equal with that of for instance the vacuum fusion, Al alloy raw material of more uniform dispersion can be obtained. A size of billet is preferable to be a diameter in the range of from approximately 100 to 500 mm.

The aforementioned billet, after primary heat treatment, is cooled. The primary heat treatment is preferable to implement at a temperature of from 450 to 600° C. for more than 5 hours. By such heat treatment, the added elements and impurity elements can be homogenized. The cooling here can be any one of air-cooling, furnace cooling, and quenching.

Next, plastic working such as forging or rolling is implemented. In the plastic working due to the forging, it is preferable to give a working rate in the range of from 30 to 80%. In the plastic working due to the rolling, the working rate is preferable to be in the range of from 40 to 99%. According to the plastic working of such working rates, due to thermal energy applied to the ingot during the treatment, the added elements such as elements that forms an intermetallic compound, in addition to these impurity elements such as Cr, Fe and C can be uniformly dispersed. In addition, the thermal energy plays a roll of coordinating the arrangement of crystal lattice to effectively work in removing minute internal defects.

Thereafter, as a secondary heat treatment, heating is implemented at a temperature of from 200 to 500° C. for more than 10 min. Thus obtained raw material is machined to produce a sputtering target of a prescribed size.

The sputtering target of the present invention can contain, in addition to the elements being added such as elements that form an intermetallic compound, at least one kind of element selected from Ar and Kr in the range of 5% by weight or less (not including 0% by weight). Ar and Kr enhance reactivity of the intermetallic compound and the element itself that form an intermetallic compound during etching. That is, in etching the intermetallic compound or the element that forms the intermetallic compound, Ar and Kr exhibit a catalytic effect. Further, Ar or Kr acts effectively in microprecipitation of the intermetallic compound or the element itself that forms the intermetallic compound. Accordingly the intermetallic compound or the element itself that forms the intermetallic compound in the obtained sputtered film (Al wiring film) can be finely and uniformly precipitated inside Al grains or at the grain boundaries of the Al.

Thus, etching reactivity of the intermetallic compound or the element that forms the intermetallic compound in the Al wiring film is enhanced due to Ar or Kr. In addition to this, the intermetallic compound or the element itself that forms the intermetallic compound can be finely and uniformly precipitated in the Al wiring film due to Ar or Kr. Thereby, the etching property of the entire Al wiring film can be remarkably improved. Accordingly, in forming a wiring network in the Al wiring film by use of the dry etching method or the like, the etching residue can be suppressed in occurrence.

Further, the fine and uniform precipitation of the intermetallic compound and the element itself that forms the intermetallic compound can also suppress the dusts from occurring during sputtering. Accordingly, the Al wiring film formed by the use of the sputtering target of the present invention is excellent in forming a fine wiring network.

The content of at least one kind of element selected from Ar and Kr is in the range of 5% by weight or less with respect to the sputtering target. When the content of Ar or Kr exceeds 5% by weight, excess Ar or Kr precipitates at the grain boundary of Al or the like to result in a decrease of etching property to the contrary. The more preferable content of Ar or Kr is in the range of from 1 ppb by weight to 0.1% by weight, the further preferable content being in the range of from 1 to 100 ppm by weight.

A production method of a sputtering target containing Ar or Kr is not particularly restricted, and a known production method such as fusion method or powder metallurgy method can be employed.

When the fusion method is employed, first a prescribed amount of an element that forms an intermetallic compound such as Y is compounded with Al, the compounded body being induction fused in a vacuum. At this time, by bubbling the molten metal with Ar or Kr, a prescribed amount of Ar or Kr can be contained in the molten metal. Thus, an ingot containing an element that forms an intermetallic compound such as Y and at least one kind of element selected from Ar or Kr is prepared.

When powder metallurgy method is applied, a prescribed amount of an element that forms an intermetallic compound such as Y is compounded with Al, the compounded body being treated by atmospheric sintering, hot pressing, hipping or the like to obtain a sintered body. At this time, by implementing a sintering process in an atmosphere including Ar or Kr, a sintered body that includes, together with the element that forms an intermetallic compound such as Y, Ar or Kr can be obtained.

Among the aforementioned various production methods, the fusion method is suitable because it can produce a product of relatively high density and high purity. Typical examples of Ar and Kr amounts in Al alloys are shown in Table 2 for various methods. The Ar and Kr amounts are measured by use of gas analysis method (infrared absorption method).

TABLE 2

| Production Method | Amount of Ar in Al Alloy (% by weight) | Amount of Kr in Al Alloy (% by weight) |
|---|---|---|
| Fusion Method | 0.082 | 0.002 |
| Hot Press | 0.003 | 0.023 |
| Spray Forming | 2.21 | 0.121 |
| HIP | 0.02 | 0.0083 |

The ingot obtained by the fusion method or the sintered body obtained by the powder metallurgy method undergoes hot working, cold working or the like. In addition, as the demands arise, recrystallization heat treatment or crystal orientation control is carried out to obtain an aimed sputtering target. The conditions for these are same with those mentioned above.

In the case of a target being a larger size, diffusion bonding or the like may be implemented to form the target in a desired shape. However, when a target of larger size that is employed in forming larger size LCDs is produced, it is preferable to collectively produce by use of fusion method from a view point of dust suppression during sputtering. Depending on the intended sputtering target, requirement on purity, texture, plane orientation or the like is different. Accordingly, corresponding to the aforementioned required characteristics, the production method can be properly adjusted.

The sputtering target of the present invention is bonded to a Cu backing plate to employ. In bonding a target and a backing plate, brazing by use of at least one kind of In, Zn and Sn, or brazing material including these or diffusion bonding is adopted. In addition, instead of employing a separate backing plate, it can be an integrated sputtering target in which a backing plate portion is simultaneously formed during the production of the sputtering target.

The Al wiring film of the present invention, with the aforementioned sputtering target of the present invention, can be formed by use of, for instance, long throw sputtering or reflow sputtering. The Al wiring film of the present invention may be one that is formed by use of an ordinary sputtering method.

As mentioned above, according to the sputtering target of the present invention, giant dust particles and relatively large concavities or holes can be suppressed in occurrence. Accordingly, the product yield of the Al wiring films can be remarkably improved. In addition, due to the aforementioned new sputtering methods, dense and highly oriented Al wiring films can be provided. Further, due to the added element that forms an intermetallic compound, hillock due to diffusion of Al can be effectively prevented from occurring.

Such Al wiring films of the present invention can be applied in various kinds of electronic components. As the electronic components of the present invention, semiconductor elements in which the present Al wiring films are applied in gate lines, signal lines or the like thereof can be cited. The present invention exhibits its effect in particular in semiconductor elements such as ULSI DRAM(wiring width: 0.25 to 0.18 $\mu$m) of such a high integration degree as 64 Mbit. The Al wiring films of the present invention can be employed, without restricting to the semiconductor elements, in various kinds of electronic components such as liquid crystal display devices, surface acoustic wave devices, thermal print heads or the like.

The Al wiring films of the present invention obtained by sputtering a sputtering target containing Ar or Kr are suitable for the wiring of liquid crystal display devices. In such Al wiring film, an element such as Y that forms an intermetallic compound or an intermetallic compound between the element and Al is finely and uniformly precipitated.

In such Al wiring film, simultaneously added Ar or Kr enhances etching of the element that forms an intermetallic compound. In addition, the element itself that forms an intermetallic compound and the intermetallic compound thereof with Al, due to the effect of Ar or Kr, are finely and uniformly precipitated within the grains or at grain boundaries of Al. Thereby, etching property of the Al wiring films can be remarkably improved. Further, since dust particles can be suppressed in occurrence during sputtering, fine dust particles can be also largely reduced.

Further, the diffusion of Al that accompanies heating due to the heat treatment or the like can be suppressed from occurring due to the formation of an intermetallic compound between an element that forms an intermetallic compound and Al. Accordingly, hillocks due to the diffusion of Al can be effectively prevented from occurring. Accordingly, such Al wiring films are excellent in hillock resistance and there is no chance of the hillock affecting adversely on the later process. Further, such Al wiring films are excellent in fine wiring network formation.

Such Al wiring films of the present invention can be applied in various kinds of electronic components. In specific, such as gate lines and signal lines of a liquid crystal display device (LCD), wiring networks of a semiconductor element such as ULSI or VLSI, wiring patterns of a surface acoustic wave device or a thermal print head or the like, wiring of various kinds of electronic components can be cited. In the electronic components of the present invention, thus the Al wiring films of the present invention are employed. These are particularly effective in LCD panels of larger screen size and higher definition and in semiconductor elements of finer pattern.

Next, specific embodiments of the present invention will be explained.

Embodiment 1

First, 0.5% by weight of Cu with respect to Al is compounded with Al. An ingot of intended composition is produced by use of continuous casting method (atmospheric fusion). The ingot undergoes hot rolling, cold rolling and heat treatment. Thereafter, by machining the ingot an Al alloy target of a diameter of 320 mm and a thickness of 20 mm is prepared. At this time, by varying each condition of hot rolling, cold rolling and heat treatment, 10 pieces of Al alloy targets different in dispersion degree of Cu are obtained. The dispersion degree of Cu is measured and evaluated by use of the EPMA apparatus shown in the aforementioned Table 1.

The dispersion degree of Cu is shown in Table 3. The dispersion degree of Cu, in the mapping of EPMA analysis, shows an area ratio (%) of a portion of which count number of detection sensitivity is 22 or more in a measurement area of 20×20 $\mu$m, and an area ratio (%) of a portion of which count number is 22 or more in an observation area of 200×200 $\mu$m.

With thus obtained 10 pieces of Al alloy targets, by use of the existing sputtering method, on each Si substrate of a diameter of 8 inches, an Al alloy film of a thickness of 300 nm is formed. Sputtering conditions are as follows: back pressure of $1\times10^{-5}$ Pa; DC output of 1.5 kW; and sputtering time of 1 min. Number of dust particles in each Al alloy film thus obtained is measured by use of a dust counter (WM-3). The number of dust particles is measured for each size range thereof. These measurement results are shown in Table 3.

TABLE 3

| Sample No. | Dispersion Degree of Cu | | Dust Size | | | |
|---|---|---|---|---|---|---|
| | 20 × 20 $\mu$m | 200 × 200 $\mu$m | Under 0.2 $\mu$m | 0.2 to 0.3 $\mu$m | 0.3 to 100 $\mu$m | Over 100 $\mu$m |
| 1 | 40.3 | 2.7 | 7 | 2 | 1 | 0 |
| 2 | 15.2 | 0.5 | 11 | 3 | 0 | 0 |
| 3 | 7.8 | 1.3 | 9 | 3 | 0 | 0 |
| 4 | 1.5 | 3.6 | 5 | 4 | 2 | 0 |
| 5 | 22.7 | 4.1 | 2 | 2 | 1 | 0 |
| 6 | 69.8 | 69.9 | 98 | 45 | 23 | 89 |
| 7 | 88.3 | 60.8 | 79 | 52 | 26 | 49 |
| 8 | 76.8 | 54.2 | 88 | 48 | 31 | 30 |
| 9 | 90.1 | 79.3 | 92 | 56 | 33 | 89 |
| 10 | 84.3 | 59.5 | 83 | 61 | 29 | 73 |

As obvious from Table 3, according to the sputtering targets of the present invention, the occurrence number of the dust is suppressed. The Al alloy films formed by use of such sputtering targets can remarkably improve the products yield due to the decrease of the number of dust, and can provide wiring films of uniform texture.

Embodiment 2

With 10 pieces of Al alloy targets prepared in the embodiment, except for changing the sputtering method to reflow sputtering, under identical conditions as those of embodiment 1, Al alloy films are formed and the number of dust particles is similarly measured. The results are shown in Table 4.

TABLE 4

| Sample No. | Dispersion Degree of Cu | | Dust Size | | | |
|---|---|---|---|---|---|---|
| | 20 × 20 $\mu$m | 200 × 200 $\mu$m | Under 0.2 $\mu$m | 0.2 to 0.3 $\mu$m | 0.3 to 100 $\mu$m | Over 100 $\mu$m |
| 1 | 35.6 | 0.29 | 5 | 1 | 0 | 0 |
| 2 | 12.4 | 1.8 | 8 | 4 | 2 | 0 |
| 3 | 8.5 | 3.8 | 11 | 2 | 1 | 0 |
| 4 | 1.3 | 1.5 | 9 | 8 | 0 | 0 |
| 5 | 21.9 | 0.6 | 7 | 4 | 1 | 0 |
| 6 | 70.1 | 59.4 | 152 | 89 | 35 | 890 |
| 7 | 88.5 | 68.7 | 188 | 67 | 60 | 498 |
| 8 | 75.4 | 74.1 | 232 | 82 | 51 | 730 |
| 9 | 89.8 | 87.3 | 132 | 95 | 63 | 1089 |
| 10 | 83.4 | 69.4 | 120 | 77 | 99 | 573 |

As obvious from Table 4, according to the sputtering targets of the present invention, the dust particles of a size of 0.3 $\mu$m or more are also suppressed from occurring. In particular, the giant dust particles that cause problems in the reflow sputtering or the like are suppressed from occurring. The Al alloy films formed by use of such sputtering targets can remarkably improve the product yield based on the decrease of the dust number, and can provide the wiring films of uniform texture.

Embodiment 3

To Al, various kinds of elements (Si, Cr, Y, Ni, Nd, Pt, Ir, Ta, W and Mo) are added with the respective compounding amounts shown in Table 5. The respective compounded bodies are treated by use of continuous casting method (atmospheric fusion) to prepare ingots of intended compositions. Each of the ingots undergoes hot rolling, cold rolling and heat treatment. Thereafter, due to machining, Al alloy targets of a diameter of 320 mm and a thickness of 20 mm are prepared.

At this time, by selecting properly the respective conditions of hot rolling, cold rolling and heat treatment, the dispersion degree of the added elements are controlled within the range stipulated by the present invention. The dispersion degrees of the respective added elements are measured similarly with embodiment 1.

With the respective Al alloy targets thus obtained, due to the reflow sputtering method, on each Si substrate of a diameter of 8 inches, an Al alloy film of a thickness of 300 nm is formed respectively. The sputtering conditions are as follows; a back pressure of $1\times10^{-5}$ Pa, a DC output of 1.5 kW and a sputtering time of 1 min. The dust particles in thus obtained Al alloy films each are measured similarly with embodiment 1. The results are shown in Table 5.

TABLE 5

| Sample No. | Composition of Target | Dispersion Degree of Added Element | | Dust Size | | | |
|---|---|---|---|---|---|---|---|
| | | 20 × 20 μm | 200 × 200 μm | Under 0.2 μm | 0.2 to 0.3 μm | 0.3 to 100 μm | Over 100 μm |
| 1 | Al-2 wt % Y | 10.3 | 1.7 | 7 | 2 | 1 | 0 |
| 2 | Al-3 wt % Ni | 5.2 | 0.1 | 8 | 3 | 0 | 0 |
| 3 | Al-0.8 wt % Ta | 7.8 | 1.4 | 9 | 3 | 0 | 0 |
| 4 | Al-0.5 wt % Si | 1.5 | 2.5 | 5 | 4 | 2 | 2 |
| 5 | Al-7 wt % Ir | 32.7 | 1.2 | 2 | 0 | 1 | 0 |
| 6 | Al-5 wt % Pt | 9.8 | 0.9 | 8 | 4 | 0 | 1 |
| 7 | Al-0.01 wt % W | 2.3 | 2.8 | 9 | 5 | 0 | 0 |
| 8 | Al-0.8 wt % Mo | 26.8 | 3.2 | 2 | 4 | 3 | 0 |
| 9 | Al-25 wt % Cr | 19.1 | 3.1 | 9 | 5 | 4 | 0 |
| 10 | Al-10 wt % Nd | 3.2 | 2.3 | 4 | 1 | 2 | 3 |

As obvious from Table 5, according to the sputtering targets of the present invention, though the dust particles of a size of 0.3 μm or more can be suppressed from occurring, also the giant dust particles that cause problems particularly in the reflow sputtering are suppressed from occurring. The Al alloy films formed by the use of such sputtering targets can remarkably improve the product yield due to the decrease of the number of dust particles and can provide the wiring films of uniform texture.

Al wiring films obtained by sputtering the respective Al alloy targets of the aforementioned embodiments 1 to 3 are used as Al wiring films of semiconductor elements, LCD panels and SAW devices. As a result, electronic components of high reliability can be obtained, respectively.

Embodiment 4

0.5% by weight of Cu with respect to Al is compounded with Al, the obtained compounded body being treated by use of the continuous casting method (atmospheric fusion) to prepare an ingot of an intended composition. The atmospheric fusion is carried out while bubbling Ar. Thus obtained ingot undergoes a primary heat treatment, hot rolling, cold rolling and a secondary heat treatment, followed by machining to prepare Al alloy targets of a diameter of 320 mm and a thickness of 20 mm.

At this time, by varying the respective conditions of fusion, hot rolling, cold rolling and heat treatments, a plurality of Al alloy targets of which dispersion degrees of Cr, Fe and C are different are obtained. The dispersion degrees of the respective elements are measured and evaluated by use of the EPMA apparatus shown in Table 1.

The dispersion degree of each element is shown in Table 6. The dispersion degree of each element is shown by the use of two area ratios in the mapping of EPMA analysis. One is an area ratio (%) of a portion of which count number of detection sensitivity in a measurement area of 20×20 μm is the value stipulated in the present invention or more, and the other one is an area ratio (%) of a portion of which count number of detection sensitivity in an observation area of 200×200 μm is the value stipulated in the present invention or more.

With each of thus obtained Al alloy targets, by use of reflow sputtering, on a Si substrate of a diameter of 8 inches, an Al alloy film of a thickness of 300 nm is formed, respectively. The sputtering conditions are as follows; a back pressure of $1 \times 10^{-5}$ Pa, a DC output of 1.5 kW and a sputtering time of 1 min. The dust particles in the respective Al alloy films thus obtained are measured by use of the dust counter (WM-3). The number of dust particles is measured according to the size ranges.

Next, photolithography is implemented to each of the aforementioned Al alloy films to form 30 fine lines of a width and a length of 2 μm and 2 mm each for each Al alloy film. In order to evaluate reliability of these fine lines, a test current is flowed under conditions of a current density of $10^6$ A/cm², a pass time of 200 hours and a wafer temperature of 150° C. As a result of this, snapping rates (%) are obtained based on the fine lines in which snapping occurred. The results are shown together in Table 6.

TABLE 6

| Sample No. | Element contained | Dispersion Degree of Each Element | | Number of Dust Particle (dust particles of each size/wafer) | | | Snapping Rate (%) |
|---|---|---|---|---|---|---|---|
| | | 20 × 20 μm | 200 × 200 μm | under 0.3 μm | 0.3 to 100 μm | over 100 μm | |
| 1 | Cr | 25 | 3 | 8 | 11 | 0 | 3 |
| 2 | Cr | 35 | 11 | 7 | 12 | 5 | 10 |
| 3 | Cr | 82 | 21 | 11 | 10 | 8 | 40 |
| 4 | Cr | 75 | 45 | 9 | 11 | 13 | 36 |
| 5 | Fe | 15 | 20 | 3 | 5 | 0 | 0 |
| 6 | Fe | 21 | 65 | 3 | 6 | 13 | 15 |

TABLE 6-continued

| Sample No. | Element contained | Dispersion Degree of Each Element 20 × 20 μm | Dispersion Degree of Each Element 200 × 200 μm | Number of Dust Particle (dust particles of each size/wafer) under 0.3 μm | Number of Dust Particle (dust particles of each size/wafer) 0.3 to 100 μm | Number of Dust Particle (dust particles of each size/wafer) over 100 μm | Snapping Rate (%) |
|---|---|---|---|---|---|---|---|
| 7 | Fe | 88 | 72 | 4 | 9 | 19 | 50 |
| 8 | Fe | 92 | 63 | 2 | 10 | 12 | 27 |
| 9 | C | 10 | 14 | 1 | 10 | 0 | 0 |
| 10 | C | 5 | 68 | 7 | 11 | 10 | 5 |
| 11 | C | 90 | 71 | 11 | 19 | 18 | 23 |
| 12 | C | 75 | 86 | 9 | 16 | 11 | 77 |

As obvious from Table 6, according to the sputtering targets of the present invention, occurrence number of dust particles, in particular that of giant dust particles is suppressed. Based on this, occurrence of large concavities is made remarkably small. Further, due to remarkably low occurrence number of the concavities, reliability as wiring is very high (snapping rate is low). By employing such Al alloy films as wiring film, the product yield can be largely improved, and the wiring films of uniform texture can be provided.

Embodiment 5

0.5% by weight of Cu with respect to Al is compounded with Al, the obtained compounded body being treated by use of the continuous casting method (atmospheric fusion) to prepare an ingot of an intended composition. The atmospheric fusion is carried out while bubbling Ar. Thus obtained ingot undergoes a primary heat treatment, hot rolling, cold rolling and a secondary heat treatment, followed by machining to prepare Al alloy targets of a diameter of 320 mm and a thickness of 20 mm.

At this time, by varying the respective conditions of fusion, hot rolling, cold rolling and heat treatments, a plurality of Al alloy targets are prepared. The plurality of Al alloy targets of which dispersion degrees of Cu that is added as an element that forms an intermetallic compound and of Cr, Fe and C added as impurity element are different are prepared. The dispersion degrees of these respective elements are measured and evaluated with the aforementioned EPMA apparatus shown in Table 1. The dispersion degree of each element is shown in Table 7.

The dispersion degree of Cu is shown by use of two area ratios in the mapping of EPMA analysis. One is an area ratio (%) of a portion of which count number of detection sensitivity is 22 or more in a measurement area of 20×20 μm, the other one being an area ratio (%) of a portion of which count number of detection sensitivity is 22 or more in an observation area of 200×200 μm. Each of the dispersion degrees of Cr, Fe and C denotes, in the mapping of EPMA analysis, an area ratio (%) of a portion of which count number of detection sensitivity is the stipulated value or more in a measurement area of 20×20 μm and an area ratio (%) of a portion of which count number of detection sensitivity is the stipulated value or more in a measurement area of 200×200 μm.

TABLE 7

| Sample No. | Dispersion Degree of Cu 20 × 20 μm | Dispersion Degree of Cu 200 × 200 μm | Impurity Element to be evaluated | Dispersion Degree of Impurity Element 20 × 20 μm | Dispersion Degree of Impurity Element 200 × 200 μm |
|---|---|---|---|---|---|
| 1 | 10 | 3 | Cr | 12 | 5 |
| 2 | 18 | 7 | Cr | 22 | 15 |
| 3 | 54 | 15 | Cr | 55 | 30 |
| 4 | 70 | 32 | Cr | 80 | 45 |
| 5 | 13 | 2 | Fe | 28 | 3 |
| 6 | 25 | 7 | Fe | 34 | 16 |
| 7 | 49 | 21 | Fe | 66 | 20 |
| 8 | 81 | 50 | Fe | 70 | 35 |
| 9 | 5 | 6 | C | 16 | 5 |
| 10 | 27 | 9 | C | 18 | 20 |
| 11 | 68 | 51 | C | 70 | 42 |
| 12 | 78 | 78 | C | 90 | 58 |

With each of thus obtained Al alloy targets, due to the reflow sputtering, on each of Si substrates of a diameter of 8 inches, an Al alloy film of a thickness of 300 nm is formed, respectively. The sputtering conditions are as follows: a back pressure of $1\times10^{-5}$ Pa, a DC output of 1.5 kW and a sputtering time period of 1 min. Of each of thus obtained Al alloy films, the dust particles are measured with the dust counter (WM-3). The number of dust particles is obtained for each range of particle size. Next, the snapping rate (%) of each of the aforementioned Al alloy films is obtained similarly with embodiment 4. The results are shown in Table 8.

TABLE 8

| Sample No. | Number of Dust Particle (dust particles of each size/wafer) under 0.3 μm | Number of Dust Particle (dust particles of each size/wafer) 0.3 to 100 μm | Number of Dust Particle (dust particles of each size/wafer) over 100 μm | Snapping Rate (%) |
|---|---|---|---|---|
| 1 | 3 | 1 | 0 | 0 |
| 2 | 7 | 2 | 0 | 5 |
| 3 | 8 | 3 | 0 | 12 |
| 4 | 111 | 17 | 255 | 40 |
| 5 | 8 | 3 | 0 | 0 |
| 6 | 10 | 6 | 0 | 7 |
| 7 | 11 | 7 | 0 | 20 |
| 8 | 17 | 20 | 378 | 54 |
| 9 | 2 | 2 | 0 | 0 |

TABLE 8-continued

| Sample No. | Number of Dust Particle (dust particles of each size/wafer) | | | Snapping Rate (%) |
|---|---|---|---|---|
| | under 0.3 μm | 0.3 to 100 μm | over 100 μm | |
| 10 | 9 | 5 | 0 | 3 |
| 11 | 13 | 10 | 0 | 14 |
| 12 | 22 | 54 | 427 | 36 |

As obvious from Table 8, according to the sputtering targets of the present invention, though the dust particles of a size of 0.3 μm or more are also suppressed in occurrence, in particular the giant dust particles that are problematic in the reflow sputtering being suppressed from occurring. In addition, an occurrence number of concavities is also remarkably low. Based on this, reliability as wiring film is remarkably high (lower snapping rate). By employing such Al alloy films as wiring film, the product yield can be largely improved, the wiring films of uniform texture being able to be provided.

The Al wiring films obtained by sputtering each Al alloy target of the aforementioned Embodiments 4 and 5 are used as Al wiring films in semiconductor elements, LCD panels and SAW devices. As a result of this, electronic components of high reliability are obtained, respectively.

Embodiment 6

Raw material in which 6% by weight of Y is added to Al is fused by radio frequency induction (including Ar bubbling treatment) to prepare an ingot of intended composition. This ingot undergoes cold rolling and machining to obtain an Al alloy target of a diameter of 127 mm and a thickness of 5 mm. The composition of this Al alloy target is Al-6wt % Y-20 ppm Ar.

Thus obtained Al target is diffusion bonded to a backing plate made of Cu to prepare a sputtering target of the present invention. With the sputtering target, under conditions of a back pressure of 1×10⁻⁴ Pa, a DC output of 200 W and a sputtering time period of 43 min, on a revolving glass substrate of a diameter of 5 inches, an Al alloy film of a thickness of 350 nm is formed.

Of the Al alloy film, composition, resistivity, hillock density after heat treatment (573 K) and existence of etching residue are evaluated. The etching with a gas mixture of $BCl_3+Cl_2$ as etching gas is implemented to evaluate the etching residue. These results are shown in Table 9.

In addition, as comparative examples of the present invention, an Al target (Comparative Example 1) that is prepared without adding Y and Ar and an Al alloy target (Comparative Example 2) that is prepared under the same conditions with Embodiment 6 except for without adding Ar are prepared respectively. With these targets, similarly, an Al film and Al alloy film are formed by use of sputtering, respectively. Of these films, similarly with Embodiment 6, characteristics are evaluated (after heat treatment). These results are shown together in Table 9.

TABLE 9

| | Target Composition (% by weight) | Film Composition (% by weight) | Result of Characteristics Evaluation of Al Film | | |
|---|---|---|---|---|---|
| | | | Resistivity (μΩcm) | Hillock Resistance after Heat Treatment*¹ | Residue after Etching *² |
| Embodiment 6 | Al-6% Y-20 ppm Ar | Al-6% Y-5 ppm Ar | 4.1 | ○ | None |
| Comparative Example 1 | Al | Al | 2.9 | X | None |
| Comparative Example 2 | Al-6% Y | Al-6% Y | 4.2 | Δ | Yes |

*¹: ○ = Completely free of hillock
Δ = hillock existing partly
X = hillock existing over entire surface
*²: None = free of etching residue
Yes = existence of etching residue As obvious from Table 9, the Al alloy film formed by use of the sputtering target of the present invention is excellent in hillock resistance and etching property. Accordingly, by use of such Al alloy film as the wiring film, in addition to suppressing the hillock occurrence, sound and fine wiring network can be formed with reproducibility.

Embodiment 7

As shown in Table 10, sputtering targets of which contents of Y and Ar are varied are produced respectively similarly with Embodiment 6. Thereafter, by sputtering the targets under the conditions same with Embodiment 6, the respective Al alloy films (Al wiring films) are formed. The characteristics of the respective Al alloy films are measured and evaluated similarly with Embodiment 6. These results are shown together in Table 10.

TABLE 10

| Sample No. | Target Composition (% by weight) | Film Composition (% by weight) | Results of Characteristics Evaluation of Al Film | | |
|---|---|---|---|---|---|
| | | | Resistivity (μΩcm) | Hillock Resistance after Heat Treatment*¹ | Etching Residue *² |
| 1 | Al-0.5% Y-200 ppm Ar | Al-0.5% Y-70 ppm Ar | 3.4 | ○ | None |
| 2 | Al-0.7% Y-300 ppm Ar | Al-0.71% Y-15 ppm Ar | 3.8 | ○ | None |
| 3 | Al-1.6% Y-20 ppm Ar | Al-1.6% Y-5 ppm Ar | 4.1 | ○ | None |
| 4 | Al-2.7% Y-2% Ar | Al-2.65% Y-1000 ppm Ar | 4.6 | ○ | None |
| 5 | Al-4.6% Y-900 ppm Ar | Al-4.6% Y-400 ppm Ar | 5.1 | ○ | None |
| 6 | Al-7.0% Y-10 ppm Ar | Al-6.9% Y-5 ppm Ar | 6.3 | ○ | None |

Embodiment 8

Al targets in which various kinds of elements are used in the place of Y are produced (compositions are shown in Table 11) similarly with Embodiment 6. Thereafter, under the same conditions with Embodiment 6, the sputtering targets are sputtered to form the respective Al alloy films (Al wiring films). The characteristics of the respective Al alloy films are measured and evaluated similarly with Embodiment 6. These results are shown together in Table 11.

TABLE 11

| | | | Results of Characteristics Evaluation of Al Film | | |
|---|---|---|---|---|---|
| Sample No. | Target Composition (% by weight) | Film Composition (% by weight) | Resistivity ($\mu\Omega$cm) | Hillock Resistance after Heat Treatment*1 | Etching Residue *2 |
| 1 | Al-0.5% Gd-200 ppm Ar | Al-0.5% Gd-0.5 ppm Ar | 3.8 | Δ | None |
| 2 | Al-2.0% Gd-400 ppm Ar | Al-2.0% Gd-1.2 ppm Ar | 4.8 | ○ | None |
| 3 | Al-0.5% Th-250 ppm Ar | Al-0.5% Th-0.7 ppm Ar | 4.0 | Δ | None |
| 4 | Al-2.0% Th-600 ppm Ar | Al-2.0% Th-30 ppm Ar | 5.2 | ○ | None |
| 5 | Al-0.8% Re-500 ppm Ar | Al-0.79% Re-0.9 ppm Ar | 4.0 | ○ | None |
| 6 | Al-1.5% B-220 ppm Ar | Al-1.5% B-1.8 ppm Ar | 4.1 | Δ | None |
| 7 | Al-4.5% B-200 ppm Ar | Al-4.5% B-2 ppm Ar | 5.0 | Δ | None |
| 8 | Al-1.5% Sc-300 ppm Ar | Al-1.46% Sc-ppm Ar | 4.2 | ○ | None |
| 9 | Al-3.5% Sc-10 ppm Ar | Al-3.48% Sc-0.1 ppm Ar | 5.2 | Δ | None |
| 10 | Al-0.5% Nd-20 ppm Ar | Al-0.49% Nd-3 ppm Ar | 4.7 | Δ | None |
| 11 | Al-0.4% Dy-100 ppm Ar | Al-0.4% Dy-50 ppm Ar | 3.7 | Δ | None |
| 12 | Al-2.3% Dy-300 ppm Ar | Al-2.3% Dy-25 ppm Ar | 4.3 | ○ | None |
| 13 | Al-1.0% Cu-20 ppm Ar | Al-1.1% Cu-7 ppm Ar | 3.7 | ○ | None |
| 14 | Al-2.0% Cu-500 ppm Ar | Al-1.9% Cu-80 ppm Ar | 4.5 | Δ | None |
| 15 | Al-1.5% Cu-3000 ppm Ar | Al-1.5% Cu-170 ppm Ar | 4.8 | Δ | None |

Embodiment 9

6% by weight of Y with respect to Al is added to Al to prepare raw material. The prepared raw material is melted by use of radio-frequency induction heating (while bubbling with Kr) to produce an ingot of intended composition. The obtained ingot undergoes cold rolling and machining to obtain an Al alloy target of a diameter of 127 mm and a thickness of 5 mm. The composition of the Al alloy target is Al-6wt % Y-20 ppm Kr.

Thus obtained Al alloy target, under the conditions of back pressure: $1 \times 10^{-4}$ Pa, a DC output power: DC 200W and a sputtering period: 43 min, is sputtered on a rotating glass substrate of a diameter of 5 inches to form an Al alloy film of a thickness of 350 nm. Of the Al alloy film, the composition, resistivity, hillock density after heat treatment (573K), existence of etching residue are measured and evaluated. The evaluation method is identical with that of Embodiment 6.

Further, as the comparative examples of the present invention, an Al target is prepared without adding Y and Kr (comparative example 3), and an Al alloy target is prepared similarly with Embodiment 9 except for not adding Kr (comparative example 4). By implementing sputtering with each of these targets, an Al film and Al alloy film are formed.

These films are also evaluated of the characteristics (after heat treatment) similarly with Embodiment 6. These results are shown together in Table 12.

TABLE 12

| | Target Composiiton (% by weight) | Film Composition (% by weight) | Resistivity ($\mu\Omega$cm) | Hillock Resistance after Heat Treatment*1 | Etching Residue *2 |
|---|---|---|---|---|---|
| Embodiment 9 | Al-6% Y-20 ppm Kr | Al-6% Y-ppm Kr | 3.9 | ○ | None |
| Comparative Example 3 | Al | Al | 2.9 | X | None |
| Comparative Example 4 | Al-6% Y | Al-6% Y | 4.2 | Δ | Yes |

As obvious from Table 12, the Al alloy film formed by use of the sputtering target of the present invention is excellent in hillock resistance and etching property. Accordingly, by employing such Al alloy film as the wiring film, in addition to suppression of occurrence of hillock, sound and fine wiring network can be formed with reproducibility.

Embodiment 10

As shown in Table 13, Al sputtering targets in which the contents of Y and Kr are varied are produced respectively similarly with Embodiment 9. Thereafter, by sputtering the targets under the same conditions with Embodiment 9, Al alloy films (Al wiring films) are formed respectively. The characteristics of the respective Al alloy films are measured and evaluated similarly with Embodiment 9. These results are shown together in Table 13.

TABLE 13

| | | | Results of Evaluation of Characteristics of Al Film | | |
|---|---|---|---|---|---|
| Sample No. | Target Composition (% by weight) | Film Composition (% by weight) | Resistivity ($\mu\Omega$cm) | Hillock Resistance after Heat Treatment*1 | Etching Residue *2 |
| 1 | 1-0.5% Y-200 ppm Kr | Al-0.49% Y-0.7 ppm Kr | 3.5 | ○ | None |
| 2 | Al-0.7% Y-300 ppm Kr | Al-0.7% Y-1.1 ppm Ar | 3.7 | ○ | None |
| 3 | Al-1.6% Y-20 ppm Kr | Al-1.55% Y-0.8 ppm Kr | 4.1 | ○ | None |
| 4 | Al-2.7% Y-2% Kr | Al-2.6% Y-230 ppm Kr | 4.4 | ○ | None |
| 5 | Al-4.6% Y-900 ppm Kr | Al-4.56% Y-20 ppm Kr | 5.0 | ○ | None |
| 6 | Al-7.0% Y-10 ppm Kr | Al-6.9% Y-0.1 ppm Ar | 6.7 | ○ | None |

Embodiment 11

Al targets in which in the place of Y various kinds of elements are employed (compositions are shown in Table 14) are produced similarly with Embodiment 9. Thereafter, under the same conditions with Embodiment 9, the sputtering targets are sputtered to form the respective Al alloy films (Al wiring films). The characteristics of the respective Al Embodiment 9. These results are shown together in Table 14.

TABLE 14

| Sample No. | Target Composition (% by weight) | Film Composition (% by weight) | Resistivity ($\mu\Omega$cm) | Hillock Resistance after Heat Treatment*1 | Etching Residue *2 |
|---|---|---|---|---|---|
| 1 | Al-0.5% Gd-200 ppm Kr | Al-0.5% Gd-50 ppm Kr | 3.7 | Δ | None |
| 2 | Al-2.0% Gd-400 ppm Kr | Al-1.92% Gd-19 ppm Kr | 5.1 | ○ | None |
| 3 | Al-0.5% Th-250 ppm Kr | Al-0.46% Th-20 ppm Kr | 4.4 | Δ | None |
| 4 | Al-2.0% Th-600 ppm Kr | Al-1.91% Th-6 ppm Kr | 5.4 | ○ | None |
| 5 | Al-0.8% Re-500 ppm Kr | Al-0.75% Re-0.1 ppm Kr | 4.2 | ○ | None |
| 6 | Al-1.5% B-220 ppm Kr | Al-1.49% B-2.2 ppm Kr | 4.3 | Δ | None |
| 7 | Al-4.5% B-200 ppm Kr | Al-4.5% B-18 ppm Kr | 5.0 | Δ | None |
| 8 | Al-1.5% Sc-300 ppm Kr | Al-1.47% Sc-3 ppm Kr | 4.2 | ○ | None |
| 9 | Al-3.5% Sc-10 ppm Kr | Al-3.48% Sc-0.8 ppm Kr | 5.2 | Δ | None |
| 10 | Al-0.5% Nd-20 ppm Kr | Al-0.5% Nd-1.2 ppm Kr | 4.7 | Δ | None |
| 11 | Al-0.4% Dy-100 ppm Kr | Al-0.39% Dy-3 ppm Kr | 3.9 | Δ | None |
| 12 | Al-2.3% Dy-300 ppm Kr | Al-2.27% Dy-20 ppm Kr | 4.3 | ○ | None |
| 13 | Al-1.0% Cu-30 ppm Kr | Al-0.9% Cu-5 ppm Ar | 3.5 | ○ | None |
| 14 | Al-1.5% Cu-400 ppm Kr | Al-1.5% Cu-30 ppm Kr | 4.7 | Δ | None |
| 15 | Al-2.0% Cu-650 ppm Kr | Al-2.0% Cu-90 ppm Kr | 4.9 | Δ | None |

Al wiring films formed by sputtering the respective Al alloy targets of the aforementioned Embodiments 6 through 11 are employed as gate lines and signal lines of LCD panels, wiring networks of semiconductor elements, and wiring of SAW devices and TPHs. As a result of this, electronic components of high reliability are obtained respectively.

INDUSTRIAL APPLICABILITY

As obvious from the aforementioned explanation, according to the sputtering targets of the present invention, giant dust particles and relatively large concavities can be remarkably suppressed in occurrence. Accordingly, Al wiring films of the present invention formed by use of such sputtering targets are extremely useful as wiring films of semiconductor elements, liquid crystal display devices, surface acoustic wave devices or the like in which sound and fine wiring is demanded.

What is claimed is:

1. A sputtering target, consisting essentially of:
   at least one kind of element that forms an intermetallic compound with Al in the range of 0.1 to 20% by weight;
   at least one kind of element selected from Ar and Kr of greater than 0 and not more than 5% by weight; and
   the balance of Al.

2. A sputtering target, consisting essentially of:
   at least one kind of first element selected from the group consisting of Y, La, Ce, Nd, Sm, Gd, Th, Dy, Er, Sc, Cu, Si, Pt, Ir, Ru, Pd, Ti, Zr, V, Nb, Ta, Fe, Ni, Cr, Mo, W, Mn, Tc, Re and B in the range of 0.01 to 20% by weight;
   at least one kind of second element selected from Ar and Kr of greater than 0 and not more than 5% by weight; and
   the balance of Al.

3. An Al wiring film, consisting essentially of:
   at least one kind of element that forms an intermetallic compound with Al in the range of 0.1 to 20% by weight;
   at least one kind of element selected from Ar and Kr of greater than 0 and not more than 5% by weight; and
   the balance of Al.

4. An electronic component comprising the Al wiring film as set forth in claim 3.

5. The electronic component as set forth in claim 4:
   wherein the electronic component is a semiconductor element, a liquid crystal display device or a surface acoustic wave device.

* * * * *